Sept. 22, 1970 O. F. JOSEPH 3,530,016

METHODS OF MANUFACTURING SEMICONDUCTOR DEVICES

Filed March 8, 1968

INVENTOR
Owen Francis Joseph
BY
Baldwin Wight Diller & Brown
ATTORNEYS

United States Patent Office 3,530,016
Patented Sept. 22, 1970

3,530,016

METHODS OF MANUFACTURING SEMICONDUCTOR DEVICES

Owen Francis Joseph, Harlow, England, assignor to The Marconi Company Limited, London, England, a British company Filed Mar. 8, 1968, Ser. No. 711,691
Claims priority, application Great Britain, July 10, 1967, 31,683/67
Int. Cl. H01l 7/44
U.S. Cl. 148—189 4 Claims

ABSTRACT OF THE DISCLOSURE

The manufacturing processes involved in the production of semiconductor devices employ one or more diffusion steps, in which dopant impurities are diffused into semiconductor bodies. To ensure uniformity of properties of the semiconductor devices different batches must be subjected to the same conditions. In the known diffusion processes the number of variables involved makes uniformity of conditions very difficult to achieve.

Figure 1:
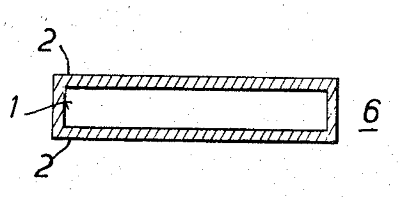

In the present invention the dopant source is in the form of a low resistance silicon body having an oxide layer which is saturated with dopant impurities. The semiconductor device which is to be doped is placed adjacent to the source, and heat is applied. The duration and degree of heating determine the extent of the diffusion of impurities from the oxide layer into the semiconductor material, thus making the uniformity properties easier to achieve.

The present invention relates to methods of manufacturing semiconductor devices.

The manufacturing processes involved in the production of semiconductor devices such as microelectronic or integrated circuits commonly employ one or more diffusion steps in which charge carrier impurities or dopants are diffused into semiconductor bodies. These diffusion steps have to be carried out under strictly controlled conditions to produce different conductivity layers of predetermined dimensions. Also, to secure uniformity of properties of the semiconductor devices different batches must be subjected to, as nearly as possible, the same conditions. In many of the presently employed diffusion processes the number of possible variables involved makes uniformity of conditions very difficult to achieve. For example, in one known process the charge carrier impurity or dopant source is in liquid form such as boron tribromide for p-type diffusion or phosphorus oxychloride for n-type diffusion and the dopant is introduced into a diffusion oven containing semiconductor bodies to be diffused by passing nitrogen and/or oxygen through the liquid source and then over the bodies. Further nitrogen is mixed with the dopant carrying gas or gases prior to its entering the oven to produce a desired vapour pressure. It can be seen, therefore, that, apart from time, there are several variables which have to be accurately controlled, i.e. the temperature of the oven; the nitrogen and oxygen mixture flow and the additional nitrogen source flow. Accurate control of these factors is extremely difficult and as a result undesired variations in the performance of different batches of silicon devices often occurs.

One proposal to overcome this problem is the use as a dopant source of a boron nitride disc, the surface of which has been oxidised to produce a $B_2O_3$ surface layer to form a source of charge carriers. In the diffusion process the disc is positioned in a stream of inert gas in a diffusion oven adjacent the semiconductor bodies in which the impurities are to be diffused and the oven temperature is then controlled to produce the correct migration rate of charge carrier impurities from the boron nitride disc oxide layer to the semiconductor bodies. The only factors controlling the rate of migration of impurities from the disc to the semiconductor bodies is the oven temperature and to a lesser extent the rate of flow of the inert gas, and these diffusion process variables have therefore been eliminated, thus greatly simplifying the process control. However at temperatures above 1050° C. the $B_2O_3$ glass surface layer becomes molten and difficult to contain, rendering the source useless for high temperature diffusion. Also the boron nitride discs are brittle, thereby requiring careful handling, and have to be kept in a warm dry atmosphere otherwise they attract moisture which will vary the properties of the oxide layers grown on them. When coated with oxide they still have to be kept in a dry atmosphere since the oxide layer absorbs moisture. Yet another disadvantage of the boron nitride disc is that the available boron nitride usually contains impurities such as calcium which would affect the properties of the oxide laye ras a dopant source.

It is an object of the invention to provide a process for the manufacture of semiconductor devices employing diffusion steps in which the number of controlled variables is reduced in comparison with the liquid dopant source process, in which diffusion can be effected at temperatures higher than 1050° C., and with a more robust dopant source than the boron nitride source.

According to this invention there is provided a method of producing controlled diffusion of charge carrying impurities into a semiconductor material in the manufacture of a semiconductor device, the method including applying heat to said material and to an adjacent dopant source in the form of a low resistivity silicon body having a surface layer of oxide substantially saturated with charge carrier impurities, the selection of the duration and degree of heating primarily determining the extent of diffusion of impurities from said oxide layer into said semiconductor material.

By "low resistivity" is meant in this specification a resistivity low enough so that migration of charge carriers will occur preferentially towards the semiconductor material from the oxide layer rather than into the silicon body of the source.

Preferably the diffusion is carried out in the presence of a flow of inert gas. This flow, whilst not essential to, assists in the migration of charge carriers from the source to the semiconductor material and at the same time helps to exclude unwanted impurities from the apparatus.

If the diffusion is an n-type conductivity diffusion then the silicon body should be of n-type silicon and said oxide layer is preferably a phosphorus silicate layer. If the diffusion is a p-type conductivity diffusion then the silicon body should be of p-type silicon and said oxide layer is preferably a boron silicate layer.

The charge carrier impurity saturated surface layer preferably has a thickness lying within the range 7,500 A. to 13,000 A.

To produce a suitable dopant source a silicon body of the desired low resistivity and conductivity type first of all has an oxide layer produced thereon whereafter the desired charge carrier impurities are diffused into the oxide layer by any form of diffusion process using an infinite source of charge carrier impurities until the oxide layer is saturated with charge carrier impurities. The diffusion process to produce the saturated oxide layer dopant source is preferably carried out with the body at a temperature of between 900° C. and 1300° C. for a duration of from 72 hours to 8 hours, the lower the temperature being used the longer the diffusion time. Although the oxide layer surface may become saturated with impurities using diffusion temperatures and times not within this range, the resultant source will not have as long a usable life.

Figure 2:
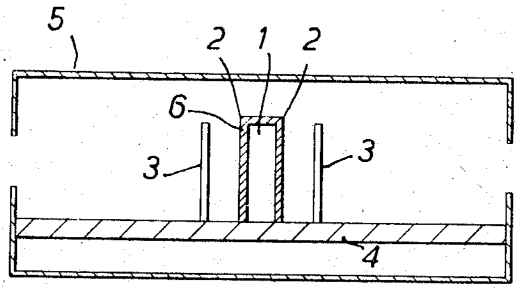

The invention will now be described with reference to the accompanying drawings in which:

FIG. 1 shows diagrammatically a dopant source for use in a method according to the invention, and FIG. 2 represents diagrammatically a dopant source as shown in FIG. 1 positioned adjacent semiconductor material bodies to be subjected to a diffusion process in accordance with the invention.

In FIG. 1 there is shown diagrammatically and not to scale a dopant source 6 comprising a body of silicon 1 which may be of either p or n type of relatively low resistivity with a surface layer 2 of silicate glass. To manufacture such a source the body first of all has an oxide layer grown on it in to which layer corresponding p or n impurities are diffused. Any form of diffusion process may be utilised provided that it will produce substantially saturation concentration of impurities in the silicate glass. For example, with a low resistivity p-type silicon body 1 boron tribromide may be utilised as a liquid dopant source in the known form of diffusion process to diffuse boron impurities into the silicon oxide layer whereby a boron silicate glass layer 2 is produced. If an n-type body 1 is used the liquid source may be phosphorus oxychloride.

The diffusion process can be effected at a temperature between 900° C. and 1300° C. for a time lying between 72 hours and 8 hours, the time and temperature being chosen so as to produce a substantially charge carrier impurity saturated silicate glass layer having a thickness of between 7,500 A. and 13,000 A.

To produce controlled diffusion of impurities in a semiconductor material utilising the source 6 of FIG. 1, the source is fixed in a jig 4, diagrammatically represented in FIG. 2, with semiconductor material wafers 3 positioned adjacent and each side of the body, the whole jig being positioned inside a diffusion oven 5. For the sake of clarity only one dopant source 6 is shown with two semi-conductor wafers 3 although in practice a number of sources would be used each positioned between two wafers 3.

Inert gas is then passed through the oven and the oven temperature set so as to provide a suitable migration rate of charge carrier impurities from the oxide layer 2 of the source 6 to the wafers 3. The temperature of the oven together with the length of time for which the source 6 and wafers 3 are heated to this temperature primarily determine the extent of the diffusion in the wafers 3. Therefore by accurately controlling the temperature of the oven and the time for which the wafers 3 are positioned in the oven the diffusion process can be accurately controlled and reproduced for different batches of wafers. The rate of flow of inert gas through the oven must also be controlled but the control required is not as critical as for the temperature and time of diffusion. This inert gas assists in the migration of charge carriers from the source to the wafers and in addition helps to exclude unwanted impurities for the apparatus. The body 1 of the source is made of sufficiently low resistivity silicon so that migration of impurities preferentially occurs towards the wafers 3 from the glass layers 2 rather than from these layers back into the body 1.

Since the dopant source is made of silicon the purity of the body can be as high as that of the wafers to be diffused which will usually be silicon wafers, and different dopant sources can therefore be made with the same properties with high accuracy. Also the dopant source can be utilised at temperatures as high as practicable for the diffusion of silicon wafers without the oxide layer becoming molten. The dopant sources are not, like the boron nitride discs, susceptible to damage by moisture, are relatively robust and can be stored between diffusions without requiring very carefully controlled storage conditions. They can also be readily cleaned if they collect dust during storage. Finally, if they are produced using the temperature and time ranges given above for the diffusion process they may be used as diffusion sources for many diffusions without the source charge carriers depleting sufficiently to materially alter the diffusion into the different batches of semiconductor wafers 3.

I claim:

1. A method of producing controlled diffusion of charge carrying impurities into a semiconductor material in the manufacture of a semiconductor device, the method including applying heat to said material and to an adjacent dopant source in the form of a low resistivity silicon body having a surface layer of oxide substantially saturated with charge carrier impurities, the selection of the duration and degree of heating primarily determining the extent of diffusion of impurities from said oxide layer into said semiconductor material.

2. A method according to claim 1 in which the diffusion is carried out in the presence of a flow of inert gas.

3. A method according to claim 1 wherein the diffusion is an n-type conductivity diffusion and said body is of n-type silicon and said oxide layer is a phosphorus silicate layer.

4. A method according to claim 1 wherein the diffusion is a p-type conductivity diffusion and said body is of p-type silicon and said oxide layer is a boron silicate layer.

References Cited

UNITED STATES PATENTS 3,164,501 1/1965 Beale et al. ---------- 148—189

L. DEWAYNE RUTLEDGE, Primary Examiner

R. A. LESTER, Assistant Examiner

U.S. Cl. X.R.

29—569; 148—186